United States Patent [19]

Chao

[11] Patent Number: 5,194,767
[45] Date of Patent: Mar. 16, 1993

[54] TTL COMPATIBLE HYSTERESIS INPUT BUFFER WITH IMPROVABLE AC MARGIN

[75] Inventor: Chai-Chin Chao, Plano, Tex.

[73] Assignee: Texas Instruments Incorporated, Dallas, Tex.

[21] Appl. No.: 630,093

[22] Filed: Dec. 19, 1990

[51] Int. Cl.$^5$ .................. H03K 19/092; H03K 19/088
[52] U.S. Cl. .................................... 307/475; 307/451; 307/456; 307/443
[58] Field of Search ............... 307/475, 451, 456, 443, 307/291

[56] References Cited

U.S. PATENT DOCUMENTS

| | | | |
|---|---|---|---|
| 3,984,703 | 10/1976 | Jorgensen | 307/290 |
| 4,464,587 | 8/1984 | Suzuki et al. | 307/290 |
| 4,563,594 | 1/1986 | Koyama | 307/443 |
| 4,687,954 | 8/1987 | Yasuda et al. | 307/451 |
| 4,779,015 | 10/1988 | Erdelyi | 307/475 |
| 5,034,623 | 7/1991 | McAdams | 307/473 |

Primary Examiner—Edward P. Westin
Assistant Examiner—Richard Roseen
Attorney, Agent, or Firm—James C. Kesterson; Richard L. Donaldson; Jay Cantor

[57] ABSTRACT

Generally, and in one form of the invention, a circuit is provided with a terminal 50 to receive an input signal which is applied to the input of an inverter 100 which is responsive to TTL level signals and which exhibits hysteresis. The output of inverter 100 is connected to two inverter chains. The first inverter chain 110, 112, 114 is comprised of an odd number of inverters and produces a first output at terminal 62 which represents a "true" version of the input signal. The second inverter chain 102, 104, 106, 108 is comprised of an even (or zero) number of inverters and produces a second output at terminal 60 which represents a "complement" version of the input signal.

10 Claims, 4 Drawing Sheets

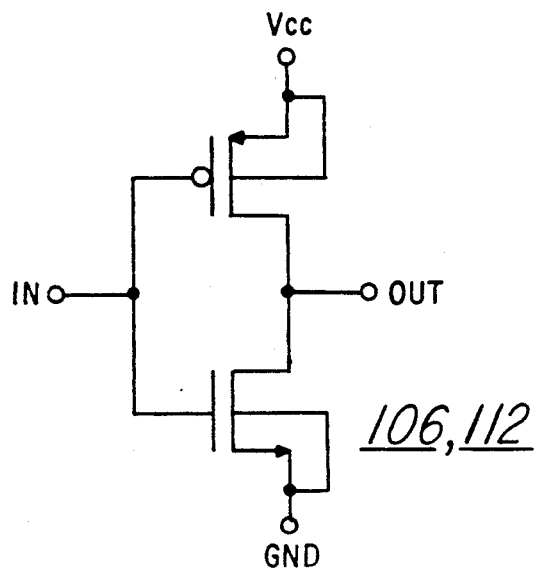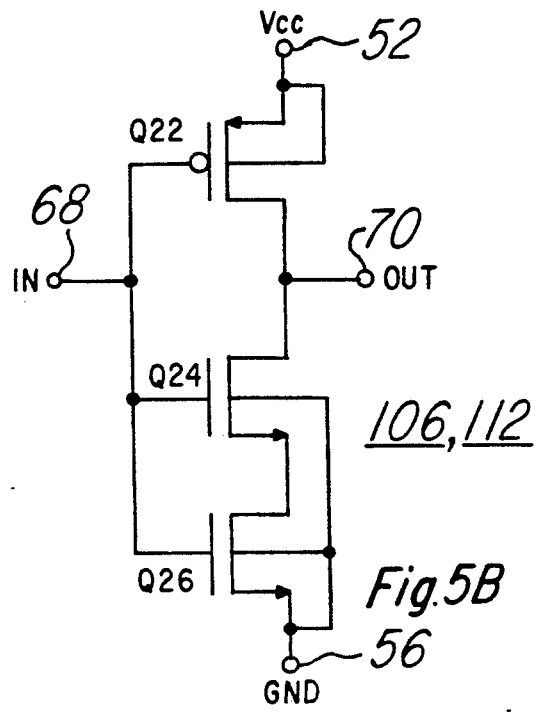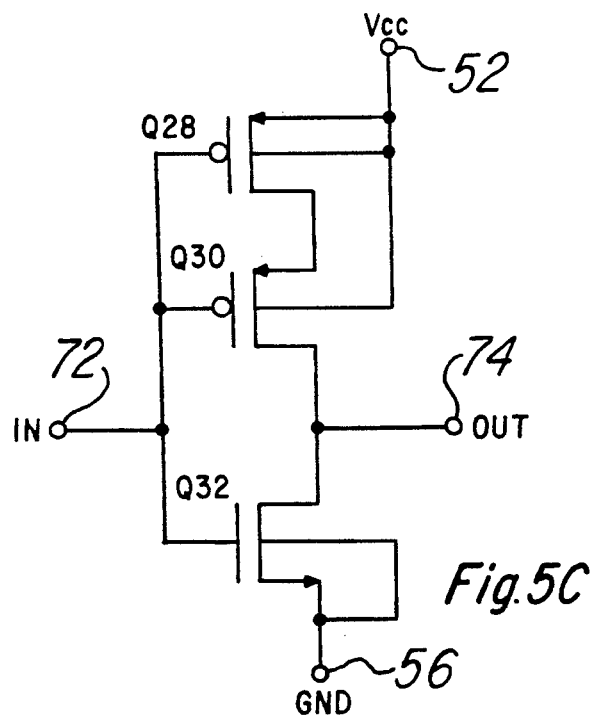

TTL COMPATIBLE HYSTERESIS INPUT BUFFER WITH IMPROVABLE AC MARGIN

CROSS-REFERENCE TO RELATED APPLICATIONS

The following coassigned patent application is hereby incorporated herein by reference: Ser. No. 07/676,996, filing date Mar. 28, 1991.

FIELD OF THE INVENTION

This invention generally relates to TTL compatible hysteresis input buffers and, more particularly, to TTL compatible hysteresis input buffers with improvable AC margin.

BACKGROUND OF THE INVENTION

Heretofore, in this field, it has been desirable to provide an input buffer for a digital signal that will provide both true and complement outputs of the input signal to an address decoder. It is also desirable that during the switching of the outputs from one logic state to the other, that both outputs are not momentarily in a high logic state. This condition could cause the address decoder output to select two different addresses at the same time.

A method for preventing both complementary outputs from momentarily being in a high logic state is to design the buffer to have improved AC margin. AC margin is defined as the time delay between a first output changing states and a second (complementary) output changing states. The delay is measured from the ½ $V_{cc}$ point on each output line. With improved AC margin, the complementary buffer outputs will switch logic states at different speeds depending on the starting logic state. For example, the transition from logic high to logic low should be much faster than the transition from logic low to logic high. In this way, the high output is always lowered before the low output can switch to logic high, thereby avoiding the state in which both outputs are at logic high.

Another desirable feature of a logic buffer is hysteresis, defined as the difference in input voltage level limits which are recognized by the device as either a logic high or a logic low. For example, a device that is activated by a logic high at 3.0 V and a logic low at 1.0 V is said to have 2.0 V total hysteresis, or a 1.0 V hysteresis window around 2.0 V. The device will not respond to an input signal that falls between 1.0 V and 3.0 V. Hysteresis is a desirable feature for an input buffer due to the fact that the address input line will have a small amplitude, high frequency noise superimposed on it when it is allowed to float in a tri-state condition (the outputs of microprocessors, which generally provide the address inputs, are usually tri-stated between active cycles). This noise has many sources, including imperfect power supplies which are not completely stable or which are prone to switching noise, and the reactive components of the transmission line impedance. This superimposed noise causes uncertainty in the logic voltage levels which could cause the buffer to misinterpret the logic value of an input signal if the logic levels were defined only as being above or below a single threshold. For example, if the logic threshold is 1.5 V, a logic high signal of 1.6 V could be erroneously read as logic low if there is a 0.2 V noise fluctuation superimposed upon it.

A prior art CMOS hysteresis buffer, which could be used as the input to an address decoder input buffer, is shown in FIG. 1. It will provide a hysteresis window around 2.5 V for a CMOS or BiCMOS circuit, but it cannot be used as a TTL compatible input buffer, since a TTL compatible circuit would require a hysteresis window around 1.5 V.

Accordingly, it is desirable to provide a TTL compatible input buffer with hysteresis and improvable AC margin. It is also desirable to accomplish this with as few stages as possible to minimize the circuit's effect on the propagation speed of the input signal.

SUMMARY OF THE INVENTION

It is herein recognized that a need exists for a TTL compatible hysteresis input buffer with improvable AC margin. The present invention is directed towards meeting those needs.

Generally, and in one form of the invention, a circuit is provided with a terminal to receive an input signal which is applied to the input of an inverter which is responsive to TTL level signals and which exhibits hysteresis. The output of this inverter is connected to two inverter claims. The first inverter chain is comprised of an odd number of inverters and produces a first output which represents a "true" version of the input signal. The second inverter chain is comprised of an even (or zero) number of inverters and produces a second output which represents a "complement" version of the input signal.

An advantage of the invention is that the hysteresis characteristic of the input inverter makes the input buffer immune to any small amplitude, high-frequency noise that may be superimposed upon the input signal and which could cause the input buffer to recognize a false logic state. A further advantage of the invention is that the two inverter chains give the opportunity to improve the AC margin of the input buffer, if desired.

BRIEF DESCRIPTION OF THE DRAWINGS

The foregoing and further aspects of the invention are illustrated in the accompanying drawings wherein like elements are denoted by like reference designators and in which:

FIG. 5A is a schematic circuit diagram of a prior art CMOS inverter.

FIG. 5B is a schematic circuit diagram of a multiple-NMOS inverter with two NMOS transistors in series.

FIG. 5C is a schematic circuit diagram of an alternative embodiment of the circuit of FIG. 5B, using multiple PMOS transistors.

DETAILED DESCRIPTION OF PREFERRED EMBODIMENTS

Figure 1:
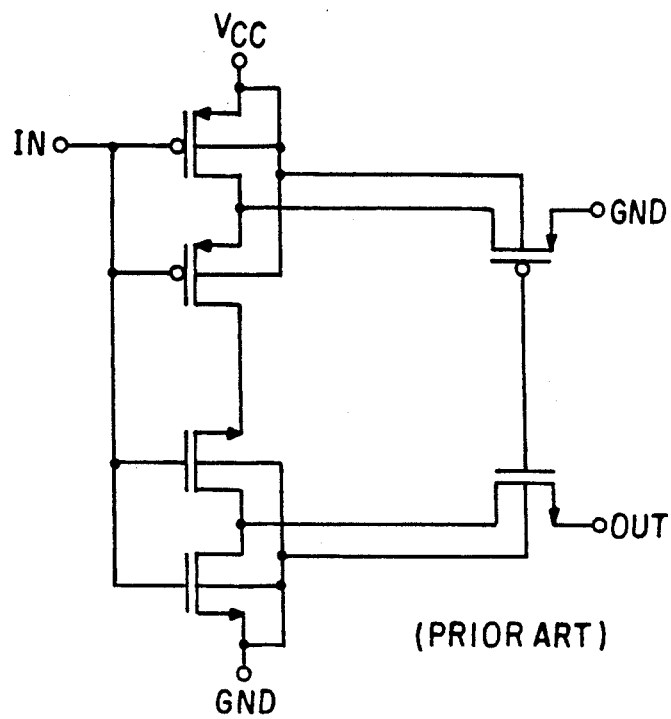
FIG. 1 is a schematic circuit diagram of a prior art CMOS input level hysteresis inverter.
Figure 2:
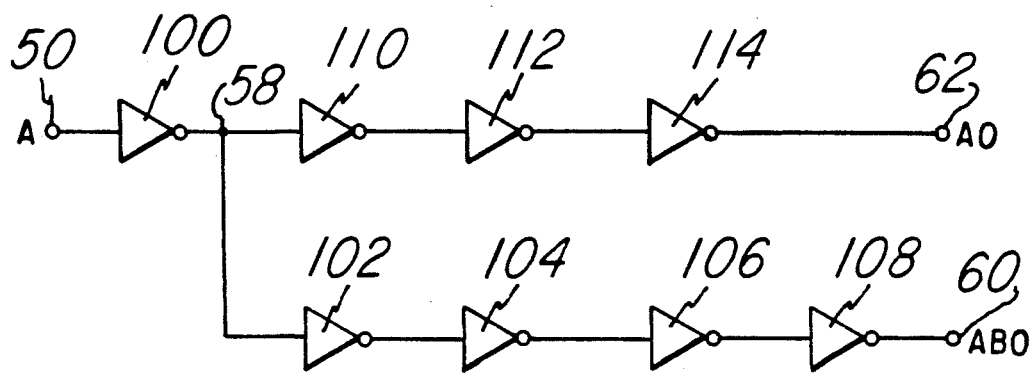
FIG. 2 is a circuit block diagram of a TTL compatible hysteresis input buffer with improvable AC margin.

With reference to FIG. 2, there is illustrated a TTL compatible hysteresis input buffer with improvable AC margin constructed in accordance with a preferred embodiment of the invention.

A hysteresis input buffer 100 is provided as the input to the circuit, accepting an input signal at terminal 50. The output of buffer 100 is connected to a node 58. A standard CMOS inverter 102 is provided, having an input coupled to node 58. The output of inverter 102 is connected to the input of a first one-way hysteresis inverter 104. The output of inverter 104 is connected to the input of an inverter 106, the output of which is connected to the input of a further inverter 108. The output of inverter 108 is coupled to a first circuit output terminal 60. A second one-way hysteresis inverter 110 has an input connected to node 58 and an output coupled to the input of an inverter 112. The output of inverter 112 is connected to the input of invertor 114, the output of which is coupled to a second circuit output terminal 62.

In operation, an input signal received at terminal 50 is applied to hysteresis input buffer 100 which will respond to a TTL logic high or logic low signal with a predetermined hysteresis window around 1.5 V. This makes the circuit of FIG. 2 immune to any small amplitude, high frequency noise that may be present on the input line, since the thresholds for logic high and logic low are designed to be separated by an amount greater than the expected maximum noise amplitude. Consequently, input buffer 100 will correctly sense the logic state of the input signal and provide an inverted output at node 58. The upper path of the circuit will invert this signal three more times (through inverters 110, 112, and 114), producing a "true" (non-inverted) signal at output terminal 62. The lower path of the circuit will invert the signal four more times (through inverters 102, 104, 106, and 108), producing a "complement" (inverted) signal at output terminal 60. Inverters 104 and 110 are implemented as one-way hysteresis inverters, which will change logic states at their outputs with different rates depending upon their starting output state. The one-way hysteresis input buffer will change from a logic high state to a logic low state much faster than it will switch from a logic low state to a logic high state. This characteristic provides increased AC margin so that the complementary output signals at terminals 60 and 62 will not be in a logic high state at the same time. It is important to note that in order to increase the AC margin, the one-way hysteresis inverter must be in a position in the inverter chain such that its output swings from high to low when it is desired that the output of the chain change logic states quickly. Hence, if the relative positions of inverters 104 and 106 in FIG. 2 were switched, the output terminal 60 would transition from low to high faster than it would transition from high to low, negating any AC margin increase provided by inverter 110.

Figure 3:
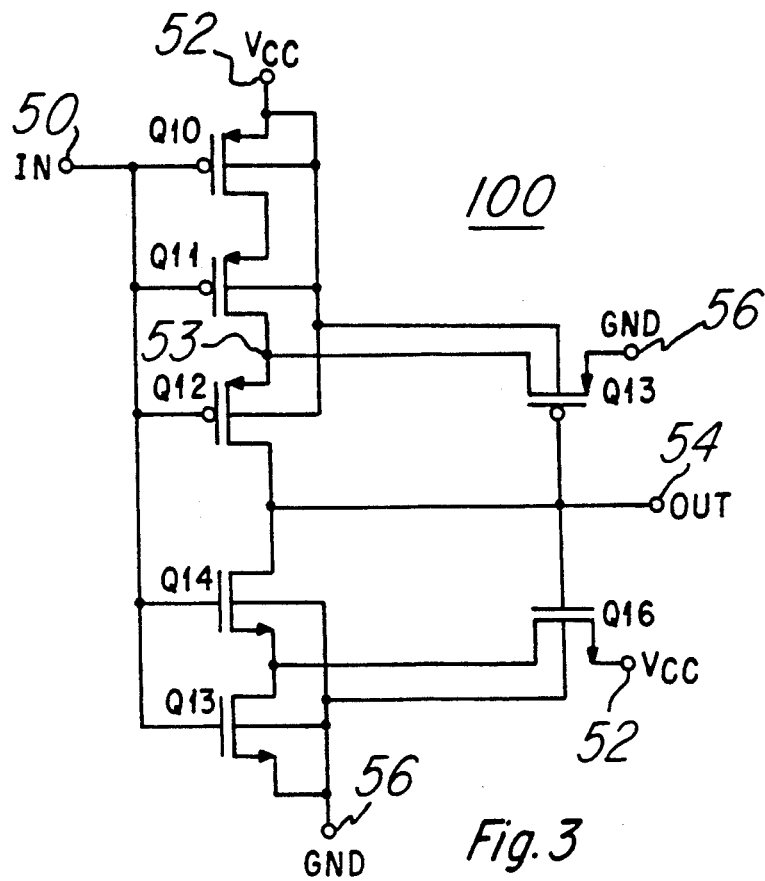
FIG. 3 is a schematic circuit diagram of a TTL input level hysteresis inverter.

FIG. 3 illustrates a preferred embodiment implementation of the TTL compatible input level hysteresis inverter 100. The buffer includes an input terminal 50 for receiving an input signal, a p-channel transistor Q10, having a source coupled to terminal 52 for receiving supply voltage $V_{cc}$ and a drain coupled to a source of a further p-channel transistor Q11. Transistor Q11 has a drain coupled to a source of a third p-channel transistor Q12. The drain of transistor Q12 is coupled to an output terminal 54. The gates of transistors Q10, Q11 and Q12 are all connected to input terminal 50. A fourth p-channel transistor, Q13, is provided, having a gate coupled to output terminal 54, a drain connected to the source of transistor Q12, and a source coupled to a further voltage supply terminal 56 for receiving a circuit ground potential. All p-channel transistors have their tanks biased to $V_{cc}$ through coupling to terminal 52. An n-channel transistor Q14 is provided, having a drain connected to output terminal 54 and a source coupled to the drain of a further n-channel transistor Q15, whose source is connected to terminal 56. The gates of transistors Q14 and Q15 are coupled to input terminal 50. A third n-channel transistor, Q16, is provided, having a gate coupled to output terminal 54, a drain connected to the drain of transistor Q15 and a source coupled to terminal 52.

In operation, with a logic low input, for example, input terminal 50 is at 0 V and output terminal 54 is at 5.0 V (logic high). Transistor Q16 is turned on and as the input begins to increase, transistor Q15 will begin to turn on gradually, dropping the voltage level of node 51. Transistor Q14 will not turn on at this time because the voltage difference between terminal 50 and node 51 is not great enough. As the input voltage at terminal 50 continues to rise, transistors Q10, Q11 and Q12 will turn off gradually, dropping node 54 below 5.0 V, causing Q16 to turn off gradually. Eventually, transistor Q15 turns on fully and node 51 drops to a voltage that is low enough to turn transistor Q14 on. Output terminal 54 will drop to 0 V, turning off transistor Q16 and turning on transistor Q13.

If input terminal 50 is, for example, at a logic high of 3.0 V and begins to decrease, transistors Q10 and Q11 will begin to turn on gradually, increasing the voltage level at node 53. Transistor Q12 will not turn on at this time because the voltage difference between terminal 50 and node 53 is not great enough. As the input voltage at terminal 50 continues to lower, transistors Q14 and Q15 will turn off gradually, raising node 54 above 0 V, causing Q13 to turn off gradually. Eventually, transistors Q10 and Q11 turn on fully and node 53 raises to a voltage that is high enough to turn on transistor Q12. Output terminal 54 will increase to 5 V, turning off transistor Q13 and turning on transistor Q16.

The size of the hysteresis window of the TTL compatible input level hysteresis inverter of FIG. 3 can be adjusted to provide hysteresis windows for approximately 100 mV to approximately 1 V, centered around 1.5 V. This is accomplished by adjusting the size ratios between Q10, Q11 and Q12 vs. Q13 or between Q14 and Q15 vs. Q16. For example, when the size ratio of Q13:Q10,Q11,Q12 is increased the hysteresis will increase because Q12 will turn on slower (i.e. at a lower "falling" input voltage). Similarly, if the size ratio of Q16:Q14,Q15 is decreased the hysteresis will decrease because Q14 will turn on faster (i.e. at a lower "rising" input voltage).

Figure 4:
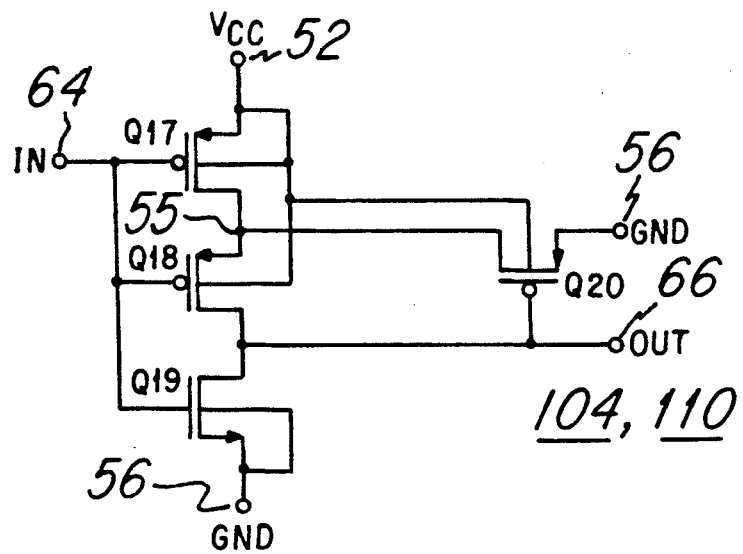
FIG. 4 is a schematic circuit diagram of a one-way hysteresis inverter.

A preferred embodiment implementation of the one-way hysteresis inverters 104 and 110 are illustrated schematically in FIG. 4. An input terminal 64 presents an input signal to the gates of p-channel transistors Q17 and Q18, as well as n-channel transistor Q19. The source of transistor Q17 is connected to voltage supply terminal 52 and its drain is coupled to the source of transistor Q18. The drain of transistor Q18 is connected to an output terminal 66. A third p-channel transistor, Q20, has a gate coupled to output terminal 66, a drain connected to the source of transistor Q18, and a source coupled to voltage supply terminal 56. P-channel transistors Q17, Q18 and Q20 all have their tanks biased to $V_{cc}$ through coupling to terminal 52. Transistor Q19 has a drain connected to output terminal 66 and a source coupled to voltage supply terminal 56. The tank of transistor Q19 is biased to ground through coupling to terminal 56.

In operation, the one-way hysteresis inverters 104 and 110 provide not only the standard inversion of the input signal, but also incorporate the feature of switching from logic high to logic low much faster than from logic low to logic high. The operation is very similar to the operation of the circuit of FIG. 3 as discussed above, with the exception that there is now only one NMOS transistor (Q19), so that when the input signal transitions from logic low to logic high, transistor Q19 turns on immediately, dropping the output to 0 V immediately. Conversely, when an input signal applied to terminal 64 is at logic high (5.0 V), output terminal 66 is at 0 V (logic low). Transistor Q20 is turned on and as the input begins to decrease, transistor Q17 will begin to turn on gradually, increasing the voltage at node 55. Transistor Q18 will not turn on at this time because the voltage difference between terminal 64 and node 55 is not great enough. As the input voltage at terminal 64 continues to lower, transistor Q19 will turn off gradually, raising node 66 above 0 V, causing Q20 to turn off gradually. Eventually, transistor Q17 turns on fully and node 55 raises to a voltage that is high enough to turn on transistor Q18. Output terminal 66 will raise to 5 V, turning off transistor Q20.

The speed with which the one-way hysteresis inverter of FIG. 4 transitions from logic low to logic high can be set without affecting the speed with which the inverter transitions from logic high to logic low. This is accomplished by adjusting the size ratios of Q17 and Q18 vs. Q20. For example, when the size ratio of Q20:Q17,Q18 is increased the hysteresis will increase because Q18 will turn on slower (i.e. at a higher "rising" input voltage). Conversely, when the size ratio of Q20:Q17,Q18 is decreased the hysteresis will decrease because Q18 will turn on faster (i.e. at a lower "rising" input voltage).

The AC margin of the TTL compatible hysteresis input buffer of FIG. 2 may also be improved by providing inverters 106 and 112 with multiple NMOS inverters. FIG. 5A illustrates a standard prior art CMOS inverter circuit. FIG. 5B is a modification of the circuit of FIG. 5A, adding a second NMOS transistor in series with the first NMOS transistor (providing for multiple NMOS inversion). Additional NMOS transistors may be added likewise for additional delay. An input terminal 68 couples an input signal to the gates of p-channel transistor Q22 and n-channel transistors Q24 and Q26. The source of transistor Q22 is connected to voltage supply terminal 52 and its drain is coupled to output terminal 70. The tank of transistor Q22 is biased to $V_{cc}$ through a coupling to terminal 52. The drain of transistor Q24 is connected to output terminal 70 and its source is coupled to the drain of transistor Q26, which has a source connected to voltage supply terminal 56. The tanks of transistors Q24 and Q26 are biased to ground through coupling to terminal 56.

In operation, when there is a transition from logic high to logic low on the input terminal 68, transistor Q22 turns on immediately, raising the output terminal 70 to 5 V immediately. Conversely, when an input signal applied to terminal 68 transitions from logic low to logic high, transistor Q26 must turn on before transistor Q24 can turn on. The output terminal 70 goes logic low just after transistor Q24 turns on. By increasing the number of NMOS transistors in series, it is possible to increase the delay of the transition from logic high to logic low on output terminal 70 without affecting the speed of the transition from logic low to logic high (which is set by the single PMOS transistor Q22). This because the NMOS transistor must turn on sequentially from the bottom to the top before the output terminal 70 will change states.

An alternative embodiment of the circuit of FIG. 5B is shown in FIG. 5C, where an input terminal 90 couples an input signal to the gates of n-channel transistor Q32 and p-channel transistors Q28 and Q30. The source of transistor Q32 is connected to voltage supply terminal 56 and its drain is coupled to output terminal 92. The tank of transistor Q32 is biased to GND through a coupling to terminal 56. The drain of transistor Q30 is connected to output terminal 92 and its source is coupled to the drain of transistor Q28, which has a source connected to voltage supply terminal 52. The tanks of transistors Q28 and Q30 are biased to $V_{cc}$ through coupling to terminal 52. The speed of this circuit is faster when transitioning from high to low, which is contrary to the operation of the circuit of FIG. 5B. Therefore, by increasing the number of PMOS transistors in series, it is possible to increase the delay of the transition from logic low to logic high on output terminal 92 without affecting the speed of the transition from logic high to logic low (which is set by the single NMOS transistor Q32). This is because the PMOS transistors must turn on sequentially from top to bottom before the output terminal 92 will change states. It should be noted that this inverter cannot be used to replace the inverter of FIG. 5B without changing its relative positioning in the inverter chain of FIG. 2 so that its speed advantage is utilized when it is desired for the inverter output to change from high to low very quickly.

Figure 6:
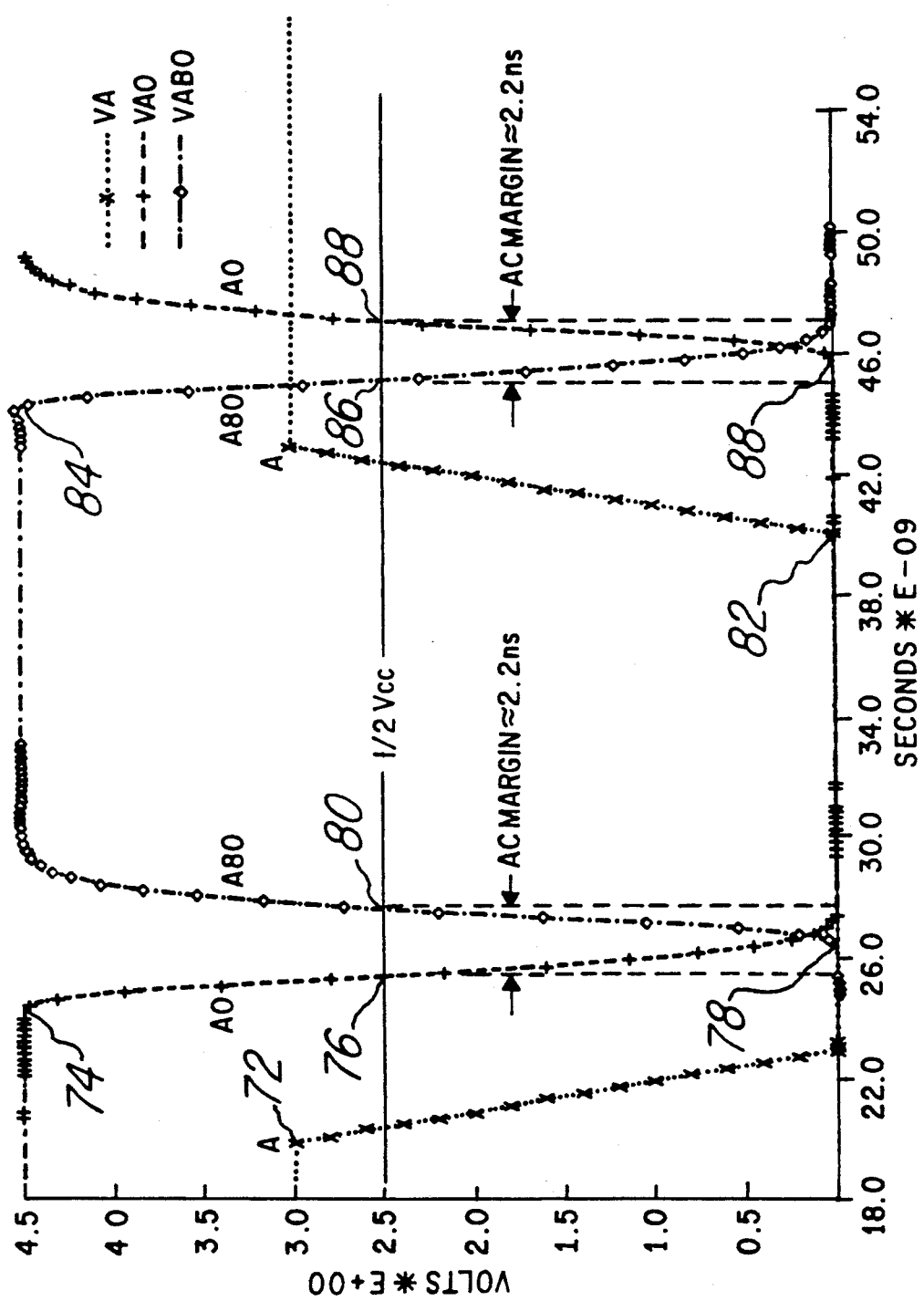
FIG. 6 is a timing diagram of the input and outputs of the circuit of FIG. 2.

FIG. 6 illustrates the relative timing relationships between the input and the output signals of the TTL compatible hysteresis input buffer of FIG. 2, incorporating the circuits of FIGS. 3, 4 and 5B. An input line, labelled A, transitions from logic high to logic low beginning at 72. Some time later, at 74, the "true" output, labelled AO, begins its transition from logic high to logic low. AO passes through the $\frac{1}{2} V_{cc}$ point at 76. The "complement" output, labelled ABO, remains at logic low until 78, at which time it begins its transition to logic high. It will be appreciated that the AO output is already at a logic low level before the ABO output begins to transition to logic high. ABO passes through the $\frac{1}{2} V_{cc}$ point at 80. The AC margin of this sequence, defined as the time delay between each of the complementary outputs transitioning through the $\frac{1}{2} V_{cc}$ level, is equal to the time delay between 76 and 80, or approximately 2.2 nanoseconds. A similar sequence of events takes place when A begins its transition from logic low to logic high at 82. Some time later, at 84, ABO begins its transition from logic high to logic low, and passes through the $\frac{1}{2} V_{cc}$ point at 86. AO remains at logic low until 88, at which time it begins its transition to logic high. It will once again be appreciated that the ABO output is already at a logic low level before the AO output begins to transition to logic high. AO passes through the $\frac{1}{2} V_{cc}$ point at 88. Once again, the AC margin, as measured between 86 and 88, is approximately 2.2 nanoseconds.

By providing two one-way hysteresis inverters in parallel for the true (AO) and complementary (ABO) signals, both AO and ABO will go from logic high to logic low very fast and from logic low to logic high very slow, therefore providing AC margin for AO and ABO.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A TTL compatible hysteresis input buffer with improvable AC margin, comprising:
   a first inverter having an input and an output, said inverter being responsive to TTL level input signals and exhibiting hysteresis;
   a first inverter chain, comprised of an odd number of serially coupled inverters and having a first inverter chain input and a first inverter chain output, said first inverter chain input being operatively coupled to said first inverter output; and
   a second inverter chain, comprised of an even number of serially coupled inverters and having a second inverter chain input and a second inverter chain output, said second inverter chain input being operatively coupled to said first inverter output.

2. The hysteresis input buffer of claim 1, wherein:
   a first inverter of said first inverter chain is a first one-way hysteresis inverter;
   a first inverter of said second inverter chain is a second one-way hysteresis inverter.

3. The hysteresis input buffer of claim 1, wherein:
   a first inverter of said first inverter chain comprises a plurality of N-channel transistors having a single input having a conduction path operatively coupled between a voltage supply terminal and an output of said first inverter of said first inverter chain; and
   a first inverter of said second inverter chain comprises a plurality of N-channel transistors having a single input having a conduction path operatively coupled between said voltage supply terminal and an output of said first inverter of said second inverter chain.

4. The hysteresis input buffer of claim 2, wherein said first and second one-way hysteresis inverters comprise:
   a first P-channel transistor operatively coupled to an input terminal, a source operatively coupled to a first voltage source, and a drain operatively coupled to a first node;
   a second P-channel transistor having a gate operatively coupled to said input terminal, a source operatively coupled to said first node, and a drain operatively coupled to an output terminal;
   a third P-channel transistor having a gate operatively coupled to said output terminal, a source operatively coupled to a second voltage source, and a drain operatively coupled to said first node; and
   an N-channel transistor having a gate operatively coupled to said input terminal, a drain operatively coupled to said output terminal, and a source operatively coupled to said second voltage source.

5. A TTL input level hysteresis inverter responsive to TTL level input signals and exhibiting hysteresis, wherein said inverter comprises:
   a first P-channel transistor having a gate operatively coupled to an input terminal, a source operatively coupled to a first voltage source, and drain operatively coupled to a first node;
   a second P-channel transistor having a gate operatively coupled to said input terminal, a source operatively coupled to said first node, and a drain operatively coupled to a second node;
   a third P-channel transistor having a gate operatively coupled to said input terminal, a source operatively coupled to said second node, and a drain operatively coupled to an output terminal;
   a fourth P-channel transistor having a gate operatively coupled to said output terminal, a source operatively coupled to a second voltage source, and a drain operatively coupled to said second circuit node;
   a first N-channel transistor having a gate operatively coupled to said input terminal, a drain operatively coupled to said output terminal, and a source operatively coupled to a third node;
   a second N-channel transistor having a gate operatively coupled to said input terminal, a drain operatively coupled to said third node, and a source operatively coupled to said second voltage supply; and
   a third N-channel transistor having a gate operatively coupled to said output terminal, a source operatively coupled to said first voltage supply, and a drain operatively coupled to said third node.

6. An inverter having an output which changes logic levels at different speeds depending on said output's starting logic state, wherein said inverter comprises:
   a P-channel transistor having a gate operatively coupled to an input terminal, a source operatively coupled to a first voltage source, and a drain operatively coupled to an output terminal; and
   a plurality of N-channel transistors connected in series, source to drain, having gates operatively coupled to said input terminal wherein one of said plurality of N-channel transistors has a source operatively coupled to a second voltage source and another of said plurality of N-channel transistors has a drain operatively coupled to said output terminal.

7. An inverter having an output which changes logic levels at different speeds depending on said output's starting logic state, wherein said inverter comprises:
   an N-channel transistor having a gate operatively coupled to an input terminal, a source operatively coupled to a first voltage source, and a drain operatively coupled to an output terminal;
   a plurality of P-channel transistors connected in series, source to drain, having gates operatively coupled to said input terminal wherein one of said plurality of P-channel transistors has a source operatively coupled to a second voltage source and another of said plurality of P-channel transistors has a drain operatively coupled to said output terminal.

8. The method of providing TTL compatible hysteresis input buffering, comprising the steps of: receiving a first signal;
   inverting said first signal to produce a second signal if said first signal is not within a predetermined hysteresis window;
   inverting said second signal an odd number of times to produce a first output signal; and inverting said second signal an even, or zero, number of times to produce a second output signal.

9. The method of providing TTL compatible hysteresis input buffering as described in claim 8, wherein:

said step of inverting said second signal an odd number of times includes at least one one-way hysteresis inversion; and said step of inverting said second signal an even number of times includes at least one one-way hysteresis inversion.

10. The method of providing TTL compatible hysteresis input buffering as described in claim 8, wherein:

said step of inverting said second signal an odd number of times includes at least one multiple-NMOS inversion; and said step of inverting said second signal an even number of times includes at least one multiple-NMOS inversion.

* * * * *